United States Patent [19]

Mayell et al.

[11] Patent Number: 5,701,253

[45] Date of Patent: Dec. 23, 1997

[54] ISOLATED CURRENT SHUNT TRANSDUCER

[75] Inventors: Robert James Mayell, Tucker; Richard Alan Kramer, Lawrenceville, both of Ga.

[73] Assignee: Schlumberger Industries, Inc., Norcross, Ga.

[21] Appl. No.: 416,251

[22] Filed: Apr. 4, 1995

[51] Int. Cl.$^6$ ................................. G01R 19/00
[52] U.S. Cl. ........................ 364/483; 364/480; 324/142
[58] Field of Search .................. 364/483, 480, 364/481, 492; 324/140 R, 141, 142; 361/15, 79, 65; 341/143

[56] References Cited

U.S. PATENT DOCUMENTS

| | | | |
|---|---|---|---|
| 4,300,182 | 11/1981 | Schweitzer, III | 361/79 |
| 4,500,973 | 2/1985 | Ley | 364/483 X |
| 4,978,911 | 12/1990 | Perry et al. | 324/142 |
| 5,287,107 | 2/1994 | Gampell et al. | 341/137 |
| 5,537,333 | 7/1996 | Hemminger et al. | 364/492 |

Primary Examiner—Ellis B. Ramirez
Assistant Examiner—M. Kemper
Attorney, Agent, or Firm—Leonard W. Pojunas

[57] ABSTRACT

An isolated current shunt transducer includes a current shunt that produces a voltage difference between the current shunt's first and second ends, with the voltage difference being related to a current flowing through the current shunt. The transducer also includes an isolation barrier positioned between the current shunt and a processing circuit to isolate the processing circuit from a voltage that is common to both ends of the current shunt. Two or more transducers may be included in a power meter for measuring power delivered to a load by a multiple phase power distribution circuit. In such a power meter, a processing circuit is connected to the current shunts through the isolation barriers and is operable to produce multiple phase power measurements based on the differences between the voltages at the first and second ends of the current shunts.

17 Claims, 7 Drawing Sheets

ISOLATED CURRENT SHUNT TRANSDUCER

BACKGROUND OF THE INVENTION

This invention relates to an isolated current shunt transducer for measuring electrical current.

Electric utility metering and other similar applications use a meter which measures power delivered to a residence or other power consumer across the power supply wires. The meter simultaneously measures the voltage across the pair of wires and the current through the wires, and multiplies the voltage measurement by the current measurement to produce a power measurement. One approach uses a current shunt, which is a resistor having a precise, known value, connected in series with one of the wires. The meter is configured to measure the current by measuring the voltage produced across the current shunt.

Ley, U.S. Pat. No. 4,500,973, entitled "Electronic Devices", is incorporated herein by reference and describes an electronic watt-hour meter for connection in a two-wire power distribution circuit. The meter includes a current shunt connected in series with one of the wires to measure the current, and a voltage divider connected across the wires to measure the voltage. An integrated circuit that is powered by the two wires multiplies the voltage and current measurements to produce a power measurement. The integrated circuit also controls a stepper motor that operates a mechanical counter to numerically display the power measurement in watts per hour.

The two wire power distribution circuit described in the Ley patent is typical of European residential power distribution circuits. These so-called single phase circuits include a neutral wire and a live wire, with the voltage between the two wires being 220 volts AC.

In the Ley meter, the shunt is connected in series with the live wire, and the integrated circuit is connected directly to the shunt so that the potential of the integrated circuit "floats" with the potential of the live wire. If the voltage across the integrated circuit ever exceeds a few volts, however, the integrated circuit could be damaged. To prevent this, the integrated circuit is connected to the neutral wire through step-down voltage dividers that limit the voltage across the integrated circuit to a small percentage of the voltage between the neutral wire and the live wire.

One problem with this scheme is that it can only be easily used in a single-phase environment. In multiple phase environments, the voltage differences between phases becomes too complicated.

SUMMARY OF THE INVENTION

The invention features an isolated current shunt transducer for use in measuring the power supplied by biphase or polyphase power distribution circuits. United States residential power is typically delivered through a biphase, three-wire power distribution circuit that includes a neutral wire and two live wires, with the voltage between the neutral wire and each of the live wires being about 120 volts AC. Similarly, industrial power is typically delivered through a polyphase, multiple-wire power distribution circuit that includes a neutral wire and three or more live wires, with the voltage between the neutral wire.

A meter that measures the power delivered by a biphase or polyphase power distribution circuit must measure the power delivered by each phase of the circuit and combine those measurements to produce a single power measurement. To measure the current delivered by each phase of the circuit, the current through each live wire must be measured. The isolated current shunt transducer of the invention permits these currents to be measured using current shunts, and further permits the measurements to be combined by an integrated circuit without risk that a voltage across the integrated circuit will exceed a few volts and damage the integrated circuit.

In one aspect, generally, the invention defines an isolated current shunt transducer that includes a current shunt and an isolation barrier, coupled between the current shunt and a processing circuit. The isolation barrier isolates the processing circuit from a voltage that is common to both a first end and a second end of the current shunt. The isolation barrier can be, for example, a capacitor. A capacitor blocks any DC voltage; and the inventors have determined techniques that are disclosed herein and which allow measurements to transmitted past the DC-blocking capacitor.

A voltage difference between the first and second ends of the current shunt is proportional to the current flowing through the current shunt.

Preferred embodiments of the invention include one or more of the following features.

The transducer may include an analog-to-digital converter, such as a delta-sigma converter, that is operable to convert the voltage difference between the first and second ends of the current shunt to a series of voltage pulses and positioned between the current shunt and the isolation barrier. The transducer may also include an amplifier positioned between the current shunt and the converter to produce an amplified voltage that is related to the voltage difference between the first and second ends of the current shunt. The amplifier supplies this amplified voltage to the analog-to-digital converter for use in creating the series of digital pulses. In addition, the transducer may include a power supply that supplies operating power to the amplifier and the analog-to-digital converter. Typically, the power supply is powered by an external power source, and an isolation barrier is positioned between the power supply and the external power source.

The transducer may be implemented as part of a power meter that includes processing circuitry that is connected to the current shunt through the isolation barrier. The processing circuitry is typically operable to produce power measurements based on the difference between the voltages at the first and second ends of the current shunt. When the transducer is used in a power meter, the power meter also includes circuitry, such as a voltage divider, that is configured to produce a measurement of the voltage that is common to the first and second ends of the current shunt. In this case, the processing circuitry is operable to produce power measurements based on the difference between the voltages at the first and second ends of the current shunt, which reflects the current through the current shunt, and the voltage that is common to the first and second ends of the current shunt.

In another aspect, generally, the invention features the use of the transducer in a power meter for measuring power delivered to a load by a multiple phase power distribution circuit. Typically, the power meter includes at least two current shunts, each of which is connected in series with a live wire of the power distribution circuit. Processing circuitry is connected to the current shunts through isolation barriers, such as isolation capacitors, and is operable to produce multiple phase power measurements based on voltage differences between the first and second end of each shunt.

The power meter may also include analog-to-digital converters, such as delta-sigma converters, that are operable to convert the voltage difference between the first and second end of each shunt to a series of voltage pulses. The converters are positioned between each current shunt and the shunt's corresponding isolation barrier. The power meter may further include amplifiers positioned between the shunts and the converters and operable to amplify the voltage differences between the first and second ends of the shunts.

The power meter may also include voltage measurement circuits to measure the voltages of the live wires of the power distribution circuit. In this case, the processing circuitry is operable to produce composite power measurements based on the voltage differences between the voltages at the first and second ends of the current shunts (which reflect the currents through the live wires) and the measured voltages. The voltage measurement circuits may include voltage dividers connected between the live wires and a neutral wire of the power distribution circuit.

Other features and advantages of the invention will be apparent from the following description of preferred embodiments, and from the claims.

BRIEF DESCRIPTION OF THE DRAWINGS

These and other aspects of the invention will now be described in detail with reference to the accompanying drawings, wherein.

DESCRIPTION OF THE PREFERRED EMBODIMENTS

Figure 1:
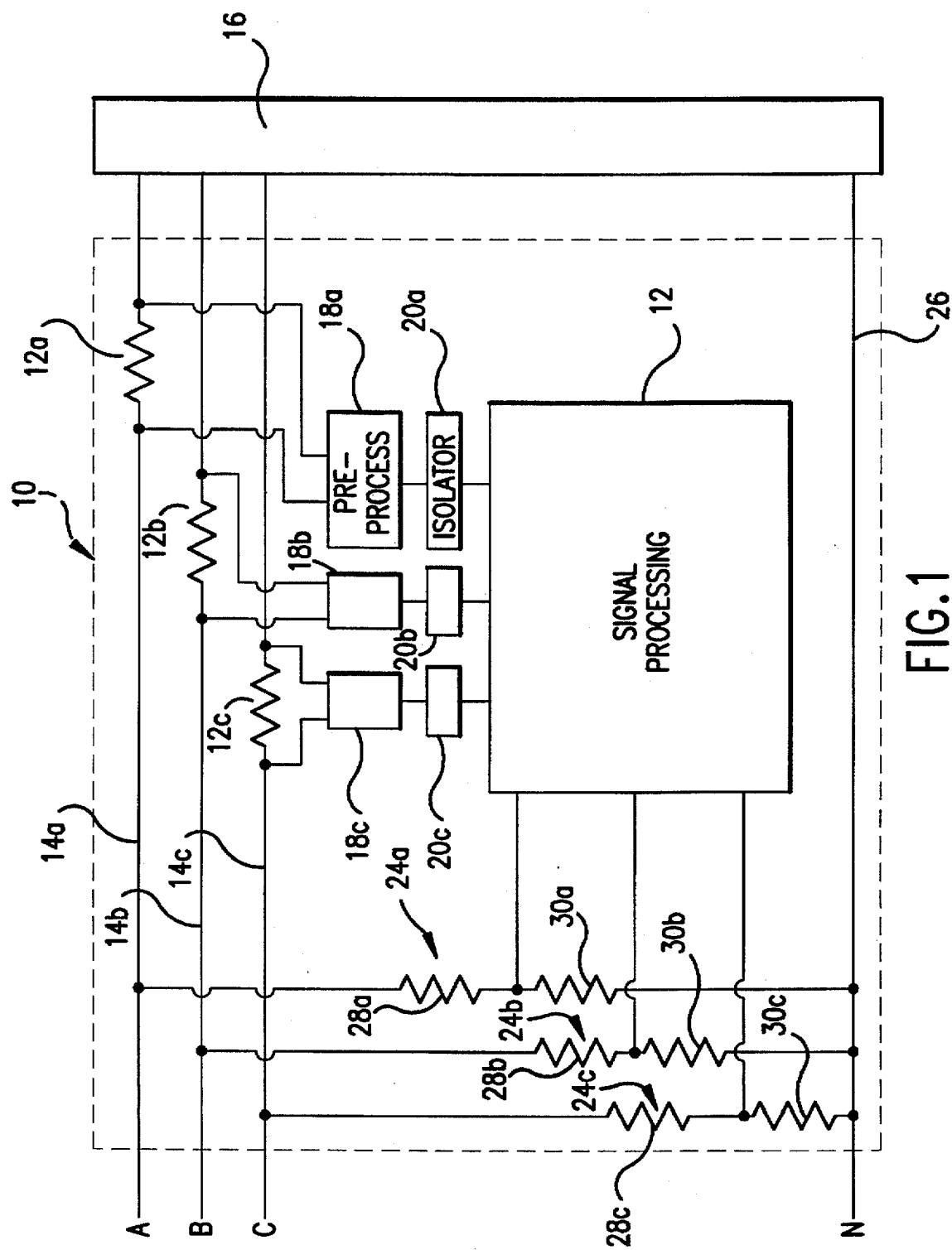
FIG. 1 is a circuit diagram of a polyphase power meter using isolated current shunts.

FIG. 1 shows a polyphase power meter 10 which includes current shunts 12a–12c, each of which is connected in series with a live wire 14 to produce a voltage that corresponds to current delivered by the live wire 14 to a load 16. Throughout this specification and claims, the term "live wire" denotes a wire which is current conducting, e.g. the hot wire in a two wire circuit. Each current shunt is connected through a pair of input wires to a preprocessing circuit 18a–18c that converts the voltage across the current shunt, which typically has a value on the order of 10 microvolts, to a voltage suitable for transmission across an isolation barrier. Each preprocessing circuit 18 supplies a signal to an input terminal of an isolation device 20a–20c such as, for example, an isolation capacitor. The isolation devices 20a–20c, in turn, each supply a signal to a common signal processing circuit 22.

The use of isolation devices 20 ensures that a voltage applied to the signal processing circuit never exceeds a few volts, and thereby prevents damage to the signal processing circuit due to excessive voltage. Each current shunt is connected in series with a live wire so that a common-mode voltage, common to both terminals of a current shunt, corresponds to the voltage of the live wire to which the current shunt is connected. This common mode voltage is typically on the order of hundreds of volts. By contrast, the signal processing circuit is typically designed to operate with voltages of less than ten volts, and would be damaged if directly connected to the current shunts. However, because the isolation devices do not pass the voltages that are common to both terminals of the current shunts, these large voltages are preventing from reaching the signal processing circuit and possibly causing damage thereto.

Voltage dividers 24a–24c are each connected between a live wire 14 and a common neutral wire 26 to produce a voltage that corresponds to the voltage delivered by the live wire to the load 16. Each voltage divider includes a first resistor 28 positioned between the live wire and an input terminal of the signal processing circuit 22, and a second resistor 30 positioned between the input terminal and the neutral wire. To ensure that the voltages applied to the input terminals of the signal processing circuit do not exceed acceptable levels, the resistance of each resistor 28 is substantially larger than the resistance of a corresponding resistor 30. Typically, resistors 28 are at least one hundred times larger than resistors 30.

Signal processing circuit 22 uses the signals provided by the voltage dividers and the isolation devices to produce polyphase power measurements. Typically, the power measurements for a polyphase circuit are produced by generating power measurements for each phase of the circuit and summing those measurements to produce composite measurements for the entire circuit. The measurements may include, for example, instantaneous, active, reactive, phasor and apparent power. Instantaneous power is defined as the product of the magnitude of the voltage on a line and magnitude of the current through the line at any moment in time. Active power is defined as the integral over time of the instantaneous power (active power may also be defined as the product of the root-mean-squared voltage, the root-mean-squared current, and the cosine of the phase angle between the voltage and current waveforms). Reactive power is defined as the product of the active power and the sine of the phase angle between the voltage and current waveforms. Phasor power equals the square root of the sum of the active power squared and the reactive power squared. Apparent power is defined as the product of the root-mean-squared voltage and the root-mean-squared current. The measurements may also include a measurement of the power factor, which is defined as the active power divided by the apparent power.

Figure 2:
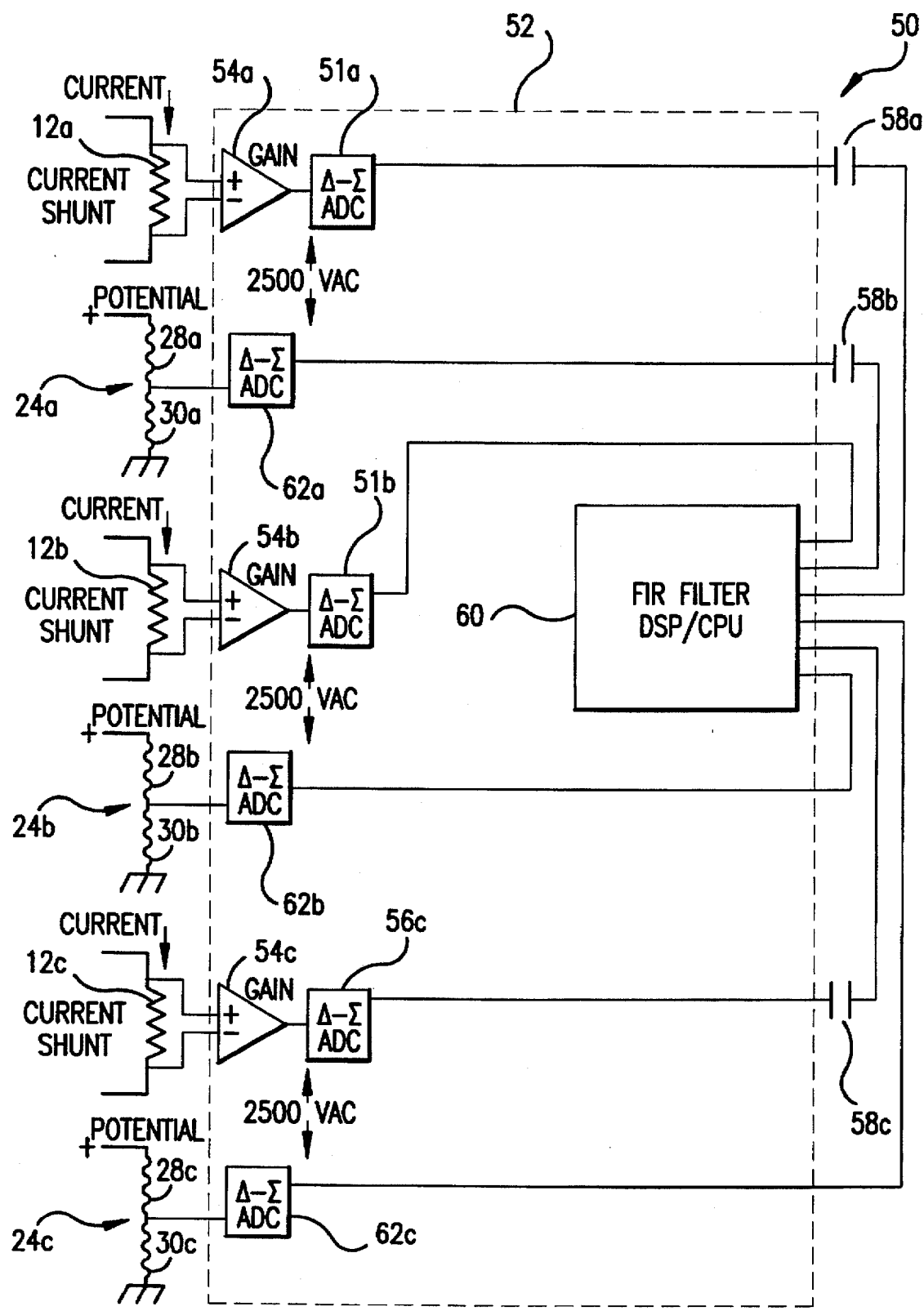
FIG. 2 is a block diagram of a single chip implementation of a polyphase power meter using isolated current shunts.

FIG. 2 shows multiple integrated circuits in a particular embodiment in which a meter 50 is implemented on a single silicon chip 52. Each current shunt 12 in meter 50 is connected to an amplifier 54. Each amplifier produces an output signal that is an amplified version of the voltage across the current shunt, and supplies this output signal to an input terminal of a delta-sigma analog-to-digital converter 56 that, as discussed in more detail below, produces a stream of digital bits that correspond to the voltage across the current shunt.

The digital bits produced by each analog-to-digital converter 56 are passed through an isolation capacitor 58 that is external to chip 52, and are thereafter supplied to a processor 60 that is internal to chip 52. The isolation capacitor filters out any voltages that are common to both terminals of the current shunt and thereby prevents damage to the processor. In addition to being isolated from the processor through external isolation capacitors 58, each amplifier 54 and converter 56 is isolated from the other amplifiers 54 and converters 56, and from the converters 62 and processor 60, by 2500 volt internal isolation barriers.

Like the current shunts, the output terminals of the voltage dividers 24 are connected to the processor through delta-sigma analog-to-digital converters 62. However, unlike the current shunts, the voltage dividers are not isolated from the processor by isolation capacitors. Such isolation is unnecessary because the voltage at the output terminals of the voltage dividers is limited to values that are within a few volts of the potential of the neutral wire 6.

Processor 60 includes a finite-impulse-response ("FIR") filter that processes the streams of bits produced by converters 56 and 62 to produce digital words. Suitable word sizes typically range from sixteen to twenty four digital bits, with an increase in the number of bits increasing the precision with which meter 50 measures power and other parameters.

The FIR filter processes the stream of bits by determining the number of logic ones occurring in a first time period. As is discussed below, the number of logic ones corresponds to the value of an analog output of an amplifier 54. If, for example, allowable values for the output of the amplifier ranged between −1 V and 1 V, a constant input of 1 V during the first time period would produce only logic ones in the stream of bits during the first period while a constant input of −1 V would produce only logic zeros. Similarly, a zero volt input would produce a stream that is half logic ones and half logic zeros.

The duration of the first time period is that which is necessary for the delta-sigma converter to produce a predetermined number of bits in the stream of bits. This predetermined number of bits is based on the number of bits in the digital word. For example, to generate a digital word having sixteen bits, the FIR filter 92 would need to process a string of 65536 ($2^{16}$) bits, and the duration of the first time period would equal 65536 divided by the rate at which the delta-sigma converter produces bits. For example, if the delta-sigma converter had a sampling rate of one megahertz, the first period would equal about 65.5 milliseconds.

Processor 60 also includes digital signal processing ("DSP") and other processing components that operate on the digital words corresponding to voltage and current measurements to produce power measurements. For example, processor 60 may multiply the digital words corresponding to the voltage and current for each phase of the circuit to produce instantaneous power measurements for each of those phases, and may thereafter sum the individual power measurements to produce a composite power measurement for the entire circuit.

Figure 3:
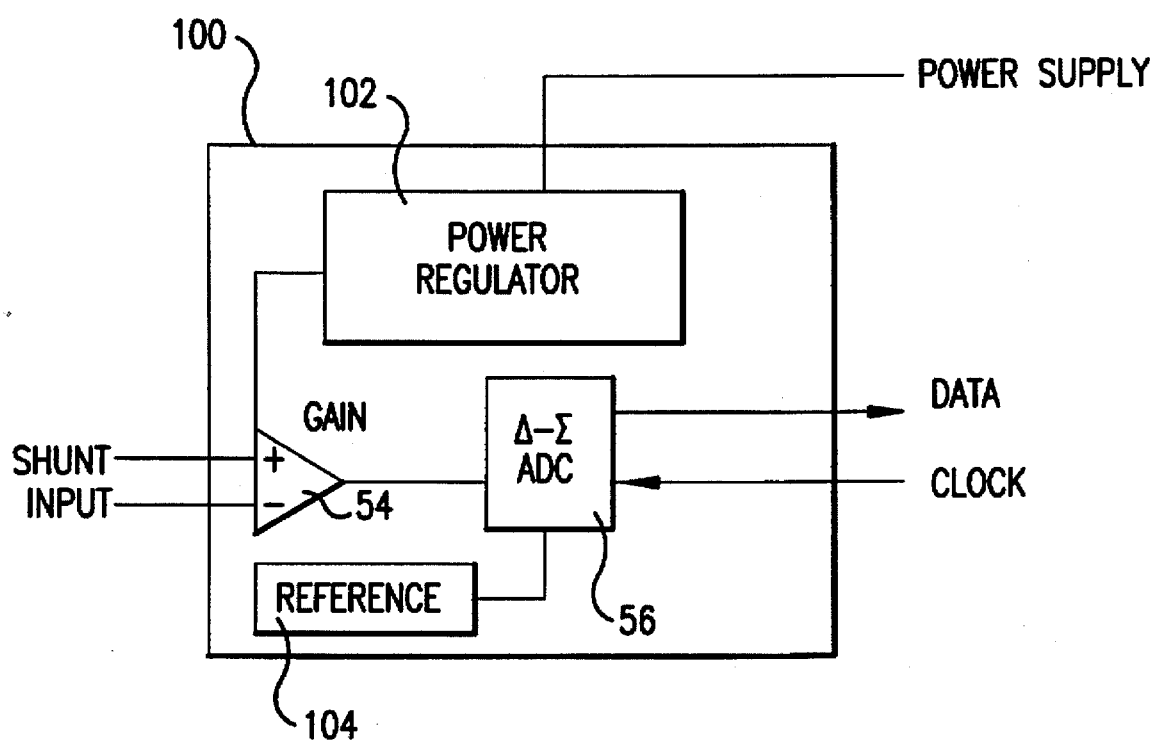
FIG. 3 is a block diagram of a current shunt sense integrated circuit.

FIG. 3 shows an amplifier 54 and a delta-sigma analog-to-digital converter 56 may also be implemented using a separate chip 100 that also includes a power regulator 102 and a voltage reference 104. Power regulator 102 produces positive and negative five volt power supplies for use by the amplifier and the delta-sigma converter. These power supplies rectify and smooth a ten volt sine wave that is supplied to chip 100 through an isolation device.

Voltage reference 104 produces a temperature stable voltage that is used by a comparator of the delta-sigma converter. Typically, voltage reference 104 includes a Zener diode connected in series with a resistor to produce a voltage of 1.25 or 2.5 volts. The voltage reference is powered by the power regulator.

Figure 4:
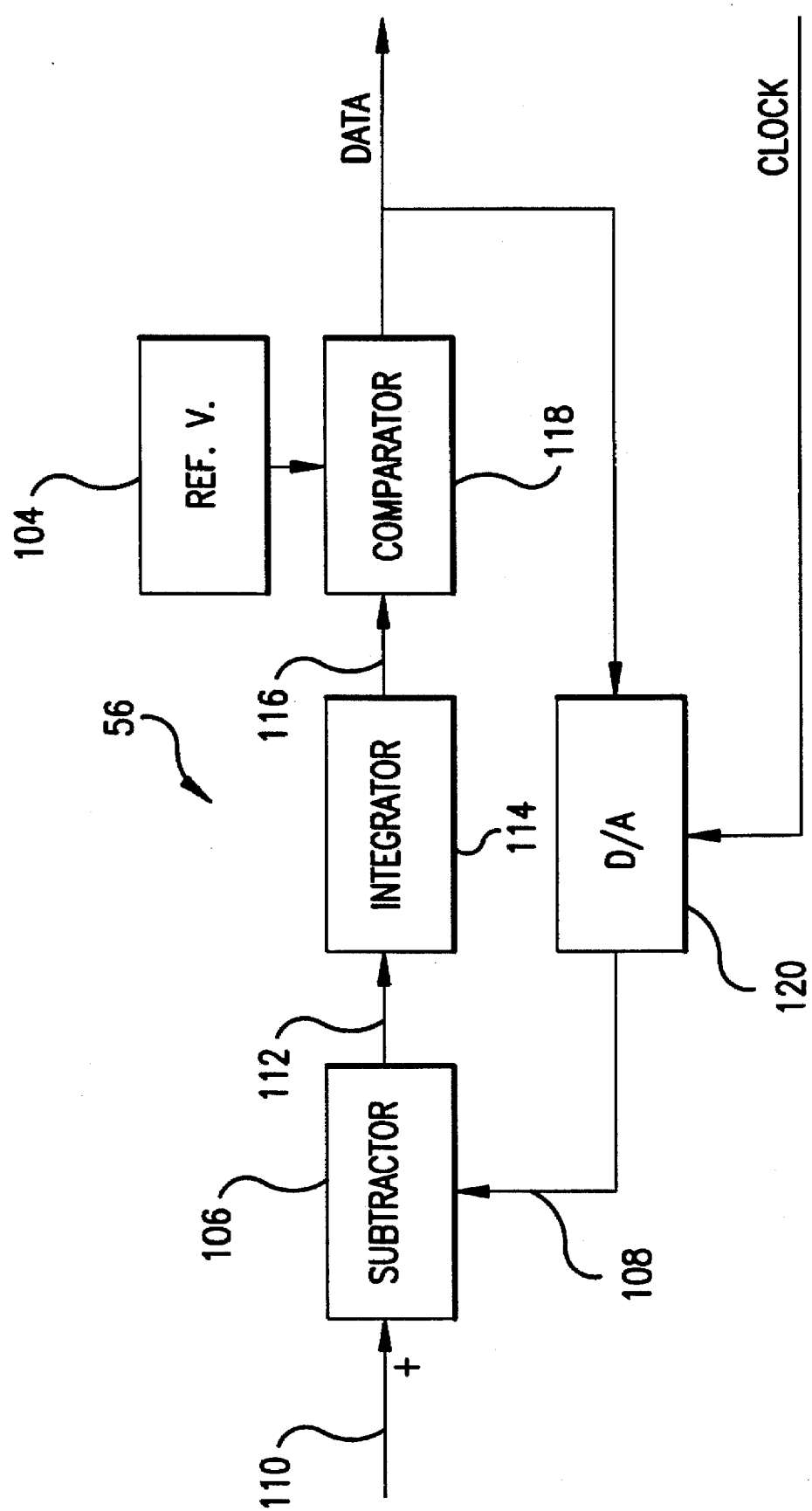
FIG. 4 is a block diagram of a delta-sigma analog to digital converter of the integrated circuit of FIG. 3.

FIG. 4 shows the delta-sigma converter 56 with a feedback loop to produce the stream of bits. The converter includes a subtractor 106 that subtracts an analog feedback signal 108 from an input signal 110. The difference 112 produced by the subtractor is applied to an integrator 114 that maintains a running total 116 of the differences 112. The running total is applied to the input of a comparator 118, the output of which is the stream of bits that constitutes the data output of the delta-sigma converter. The comparator produces a logic one when the running total exceeds the voltage produced by voltage reference 104 and a logic zero when the running total is less than this voltage. Finally, a digital-to-analog converter 120 produces the feedback signal 108 by generating a voltage equal to the maximum positive value for input signal 110 (e.g., one volt) when the current bit in the stream of bits equals a logic one, and a voltage equal to the minimum negative value for input signal 110 (e.g., negative one volt) when the current bit in the stream of bits equals a logic zero. The output of the digital-to-analog converter is permitted to change at each pulse of a clock signal that is supplied to chip 100 through an isolation device.

Table 1 illustrates the operation of a delta-sigma converter having an input voltage that ranges between −1 volt and 1 volt, and a reference voltage of 0 volts. In particular, Table 1 illustrates the signals occurring in the delta-sigma converter for a constant input voltage of 0.25 volts:

TABLE 1

| Input (110) | FB (108) | Diff. (112) | RT (116) | Output |
| --- | --- | --- | --- | --- |
| 0.25 | 0.0 | 0.25 | 0.25 | 1 |
| 0.25 | 1.0 | −0.75 ←— | −0.50 | 0 |
| 0.25 | −1.0 | 1.25 | 0.75 | 1 |
| 0.25 | 1.0 | −0.75 | 0.00 | 0 |
| 0.25 | −1.0 | 1.25 | 1.25 | 1 |
| 0.25 | 1.0 | −0.75 | 0.50 | 1 |
| 0.25 | 1.0 | −0.75 | −0.25 | 0 |
| 0.25 | −1.0 | 1.25 | 1.00 | 1 |
| 0.25 | 1.0 | −0.75 ←— | 0.25 | 1 |
| 0.25 | 1.0 | −0.75 | −0.50 | 0 |
| 0.25 | −1.0 | 1.25 | 0.75 | 1 |
| 0.25 | 1.0 | −0.75 | 0.00 | 0 |

As can be seen from Table 1, the values of the running total ("RT"), and therefore the pattern of bits in the output bit stream, repeat every eight bits (this is indicated by the lines that link the second and ninth entries for the running total in Table 1). As can also be seen, this eight bit pattern includes five logic ones.

FIG. 3 shows that chip 100 includes five terminals. Two of the terminals are connected directly to the current shunt so that the voltage of chip 100 floats with the voltage of the line to which the current shunt is connected. For this reason, the remaining terminals (i.e., the power supply's input and the converter's data output and clock input), which are connected to external circuitry, are connected through isolation devices.

Figure 5:
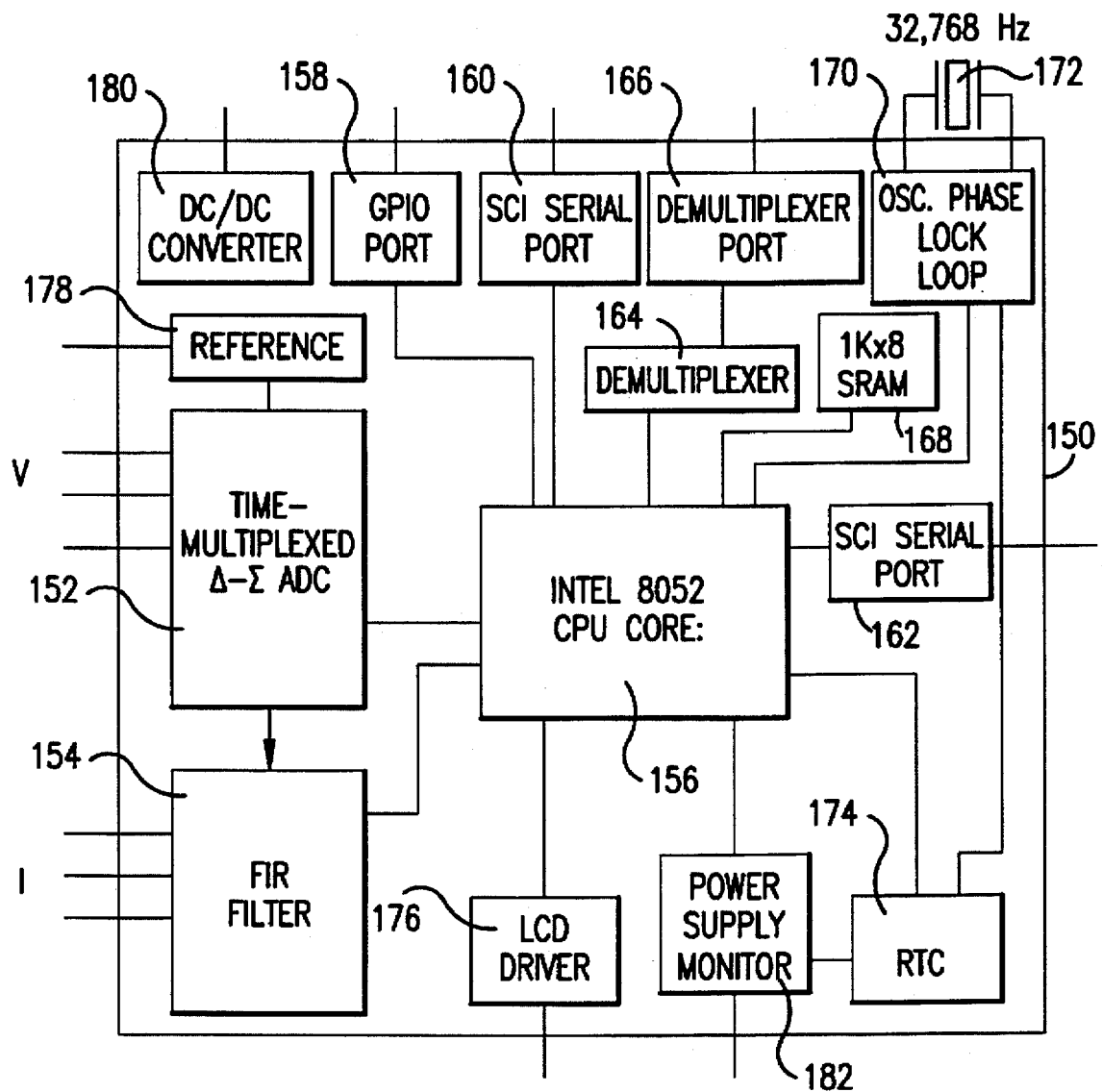
FIG. 5 is a block diagram of a processing integrated circuit.

FIG. 5 shows how processing functions may be implemented on a separate chip 150 that includes a time-multiplexed delta-sigma analog-to-digital converter 152, a FIR filter 154 and a processor 156. Like converters 56, converter 152 converts the voltage values supplied by the voltage dividers to streams of digital bits, and supplies those bit streams to the FIR filter.

In addition to the streams of digital bits representing voltage measurements from converter 152, the FIR filter 154 receives streams of digital bits representing current measurements from converters 56 (see FIG. 3). The FIR filter, which is a low pass filter, modifies the streams of digital bits to remove the effects of high frequency noise, packages the resulting streams of bits as digital words, and transmits the digital words to processor 156. The FIR filter has a sampling rate that is sufficient to obtain per phase voltage, per phase current and the phase angle between the voltage and current, and to include the seventh harmonic of a 60 Hertz AC waveform.

Processor 156 includes an enhanced, high speed processing core. Timing control for the processor is provided by a clock synthesizer 170 that is controlled by an external 32,768 Hz watch crystal 172. In addition to generating the clock for the processor, the oscillator generates a clock for the internal analog-to-digital converter 152 and for any external analog-to-digital converters 56.

Additional components of chip 150 include a voltage reference 178 that supplies a temperature stable voltage to the analog to digital converter 152, a DC/DC converter 180 that produces a power supply signal used by the amplifiers 54 and analog-to-digital converters 56 of chips 100.

Figure 6A:
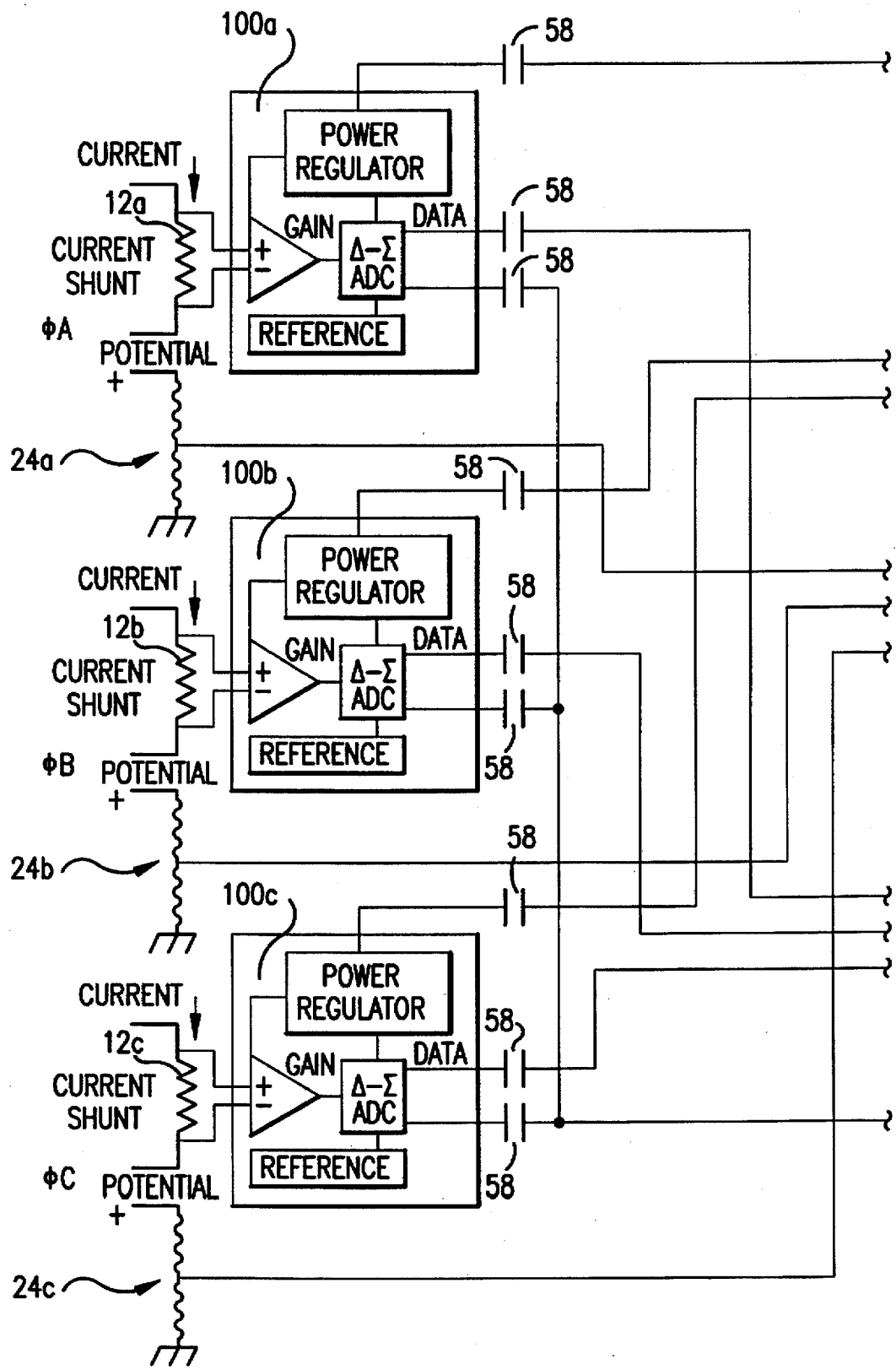
FIG. 6 is a block diagram of a multiple chip implementation of a polyphase power meter using isolated current shunts.
Figure 6B:
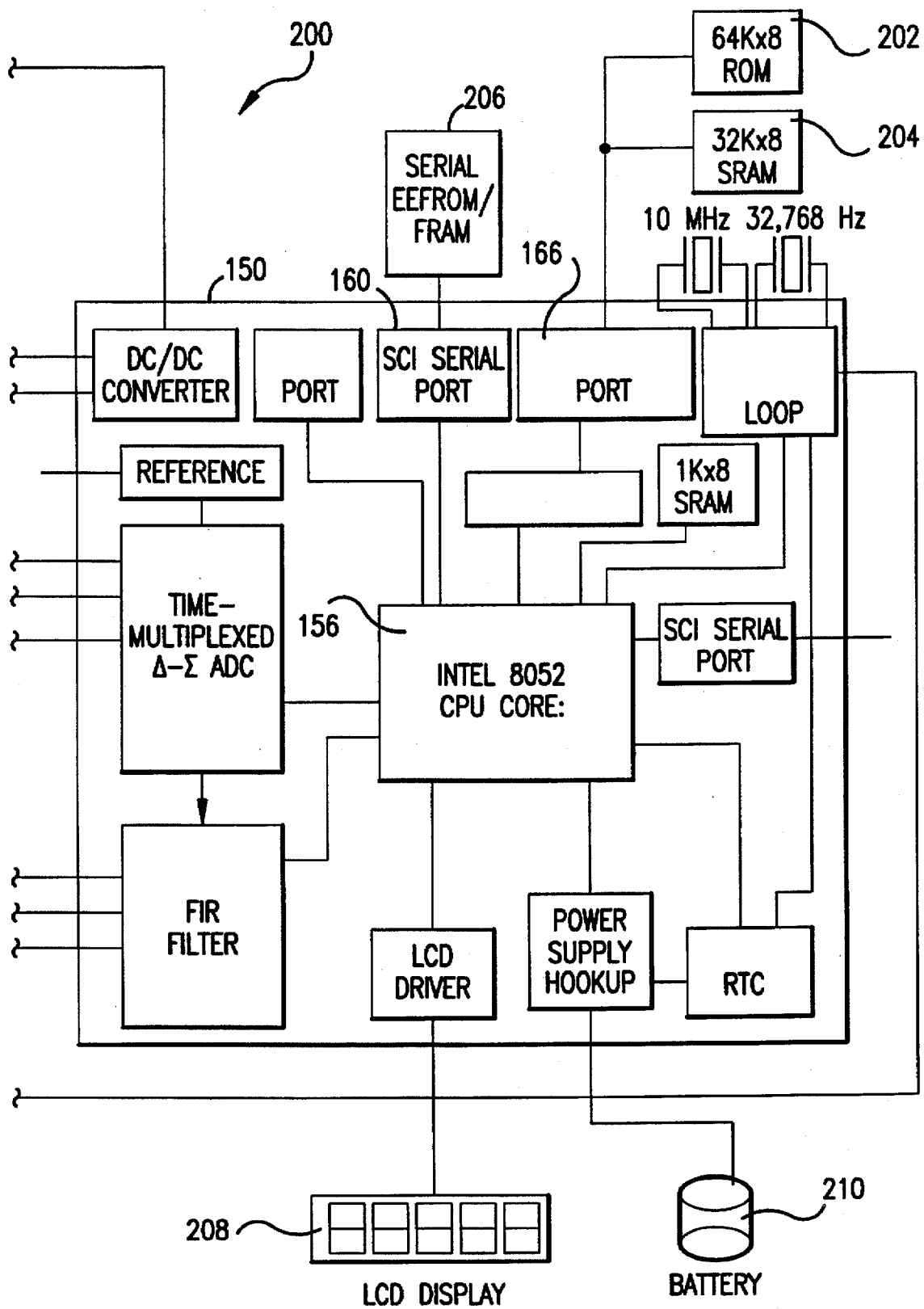

FIG. 6 shows a polyphase power meter 200 for a system having three live wires may be implemented using three chips 100 and a chip 150. In meter 200, each chip 100 is directly connected to a current shunt 12 positioned in a live wire, and is connected to chip 150 through isolation capacitors 58. Chip 150 is directly connected to three voltage dividers 24, each of which is connected to one of the live wires.

Programs used by processor 156 in producing power measurements are stored in a 64K by eight bit ROM 202 that is accessed through ports 166. Similarly, data is stored in a 32K by eight bit SRAM 204 that is accessed in the same manner. Measurements and billing information are stored in a serial non-volatile memory 206 that is accessed through port 160.

Meter 200 also includes an LCD display 208 that visually displays measurement information, and a battery 210 that provides backup power in the event of a power failure.

Although only a few embodiments have been described in detail above, those having ordinary skill in the art will certainly understand that many modifications are possible in the preferred embodiment without departing from the teachings thereof. For example, the isolation devices could be implemented using optical isolation devices such as, for example, opto-isolated buffer amplifiers or paired light emitting diodes and photodetectors.

The signal processing circuit may alternatively be implemented using analog calculation devices. Also, the meter could be implemented for use with a biphase or single phase power delivery circuit.

All such modifications are intended to be encompassed within the following claims.

What is claimed is:

1. An isolated current shunt transducer which is operatively associated with a processing circuit, comprising:
   (a) a current shunt having a first end and a second end, connected in a circuit such that a voltage difference between a voltage at the first end and a voltage at the second end is related to a current following through the current shunt;
   (b) an isolation barrier positioned between the current shunt and the processing circuit to isolate the processing circuit from a voltage that is common to both the first end and the second end of the current shunt; and
   (c) an analog-to-distal converter operable to convert the voltage difference between the first and second ends of the current shunt to a series of voltage pulses and coupled between the current shunt and the isolation barrier.

2. The transducer of claim 1, further comprising an amplifier coupled between the current shunt and the analog to digital converter to produce an amplified voltage that is related to the voltage difference between the first and second ends of the current shunt and to supply the amplified voltage to the analog-to-digital converter.

3. The transducer of claim 2, further comprising:
   (a) a power supply that supplies operating power to the amplifier and the analog-to-digital converter, the power supply being powered by an external power source; and
   (b) a second isolation barrier positioned between the power supply and the external power source.

4. The transducer of claim 1, wherein the analog-to-digital converter comprises a delta-sigma converter.

5. The transducer of claim 1, wherein the isolation barrier comprises an isolation capacitor.

6. The transducer of claim 1, further comprising processing circuitry connected to the current shunt through the isolation barrier, the processing circuitry being operable to produce power measurements based on the voltage difference between the voltages at the first and second ends of the current shunt.

7. The transducer of claim 6 wherein the circuitry configured to produce a measurement of the voltage that is common to the first and second ends of the current shunt comprises a voltage divider connected directly to the processing circuitry.

8. A power meter for measuring power delivered to a load by a multiple phase power distribution circuit, the power meter comprising:
   (a) a first current shunt connected in series with a first live wire of the power distribution circuit, wherein a difference between a voltage at a first end of the first current shunt and a voltage at a second end of the first current shunt is related to a current flowing through the first current shunt;
   (b) a second current shunt connected in series with a second live wire of the power distribution circuit, wherein a difference between a voltage at a first end of the second current shunt and a voltage at a second end of the second current shunt is related to a current flowing through the second current shunt;
   (c) processing circuitry connected to the first and second current shunts and operable to produce multiple phase power measurements based on a difference between the voltages at the first and second ends of the first current shunt and a difference between the voltages at the first and second ends of the second current shunt;
   (d) a first isolation barrier positioned between the first current shunt and the processing circuit to isolate the processing circuit from a voltage that is common to both the first end and the second end of the first current shunt;
   (e) a second isolation barrier positioned between the second current shunt and the processing circuit to isolate the processing circuit from a voltage that is common to both the first end and the second end of the second current shunt;
   (f) a first analog-to-digital converter operable to convert the voltage difference between the first and second ends of the first current shunt to a series of voltage pulses and positioned between the first current shunt and the first isolation barrier; and
   (g) a second analog-to-digital converter operable to convert the voltage difference between the first and second ends of the second current shunt to a series of voltage pulses and positioned between the second current shunt and the second isolation barrier.

9. The power meter of claim 8, further comprising:
(a) a first amplifier positioned between the first current shunt and the first converter to produce an amplified voltage that is related to the voltage difference between the first and second ends of the first current shunt and to supply the amplified voltage to the first converter; and
(b) a second amplifier positioned between the second current shunt and the second converter to produce an amplified voltage that is related to the voltage difference between the first and second ends of the second current shunt and to supply the amplified voltage to the second converter.

10. The power meter of claim 9, further comprising:
(a) a first power supply that supplies operating power to the first amplifier and the first converter, the first power supply being powered by an external power source positioned with the processing circuitry;
(b) a second power supply that supplies operating power to the second amplifier and the second converter, the second power supply being powered by the external power source;
(c) a third isolation barrier positioned between the first power supply and the external power source; and
(d) a fourth isolation barrier positioned between the second power supply and the external power source.

11. The power meter of claim 8, further comprising:
(a) a first common voltage measurement circuit configured to produce a measurement of the voltage that is common to the first and second ends of the first current shunt; and
(b) a second common voltage measurement circuit configured to produce a measurement of the voltage that is common to the first and second ends of the second current shunt,
wherein the processing circuitry is operable to produce composite power measurements based on the voltage differences between the voltages at the first and second ends of the first and second current shunts and the voltages that are common to the first and second ends of the first and second current shunts.

12. The power meter of claim 11, wherein the first common voltage measurement circuit comprises a voltage divider connected between the first live wire of the power distribution circuit and a neutral wire of the power distribution circuit, and the second common voltage measurement circuit comprises a voltage divider connected between the second live wire of the power distribution circuit and a neutral wire of the power distribution circuit.

13. The power meter of claim 8, wherein the first and second converters comprise delta-sigma analog-to-digital converters.

14. The power meter of claim 8, wherein the isolation barriers comprise isolation capacitors.

15. An isolated current shunt transducer which is operatively associated with a processing circuit, comprising:
(a) a current shunt having a first end and a second end, connected in a circuit such that a voltage difference between a voltage at the first end and a voltage at the second end is related to a current following through the current shunt;
(b) an isolation barrier positioned between the current shunt and the processing circuit to isolate the processing circuit from a voltage that is common to both the first end and the second end of the current shunt; and
(c) processing circuitry connected to the current shunt through the isolation barrier, the processing circuitry being operable to produce power measurements based on the voltage difference between the voltages at the first and second ends of the current shunt, the transducer further comprising circuitry configured to produce a measurement of the voltage that is common to the first and second ends of the current shunt, wherein the processing circuitry is operable to produce power measurements based on the voltage difference between the voltages at the first and second ends of the current shunt and the voltage that is common to the first and second ends of the current shunt.

16. The transducer of claim 15, further comprising:
(a) a second current shunt having a first end and a second end, wherein a difference between a voltage at the first end and a voltage at the second end is related to a current flowing through the second current shunt; and
(b) a second isolation barrier positioned between the second current shunt and the processing circuitry to isolate the processing circuitry from a voltage that is common to both the first end and the second end of the second current shunt,
wherein the processing circuitry is operable to produce power measurements for a multiple phase power circuit based on the difference between the voltages at the first and second ends of the first current shunt and the difference between the voltages at the first and second ends of the second current shunt.

17. The transducer of claim 16, further comprising:
(a) a first analog-to-digital converter operable to convert the voltage difference between the first and second ends of the first current shunt to a series of voltage pulses and positioned between the first current shunt and the first isolation barrier; and
(b) a second analog-to-digital converter operable to convert the voltage difference between the first and second ends of the second current shunt to a series of voltage pulses and positioned between the second current shunt and the second isolation barrier.

* * * * *